(12) United States Patent
Rodenberg, III et al.

(10) Patent No.: US 6,226,600 B1
(45) Date of Patent: May 1, 2001

(54) PROGRAMMABLE ELECTRICITY CONSUMPTION MONITOR

(76) Inventors: Ernest A. Rodenberg, III, 781 Bradburn Dr., Mt. Pleasant, SC (US) 29464; Robert Richard Borden, Slip D35 Buzzard's Roost Marina, 2408 Maybank Hwy., John's Island, SC (US) 29455

( * ) Notice: Subject to any disclaimer, the term of this patent is extended or adjusted under 35 U.S.C. 154(b) by 0 days.

(21) Appl. No.: 09/128,075

(22) Filed: Aug. 3, 1998

(51) Int. Cl.[7] .................................................. G01R 21/00
(52) U.S. Cl. ........................................ 702/61; 340/310.01
(58) Field of Search .................................. 324/142, 103; 340/178, 870.02, 538, 310.01; 702/57–62; 364/464.04, 483

(56) References Cited

U.S. PATENT DOCUMENTS

| | | | |
|---|---|---|---|
| D. 343,803 | * | 2/1994 | Ouellette et al. ..................... D10/100 |
| 4,147,978 | * | 4/1979 | Hicks .................................... 324/142 |
| 4,207,557 | * | 6/1980 | Gilkeson et al. ..................... 340/178 |
| 4,697,182 | * | 9/1987 | Swanson ........................... 340/870.02 |
| 4,701,698 | * | 10/1987 | Karlsson et al. ..................... 324/116 |
| 4,760,334 | * | 7/1988 | Crowell et al. ....................... 324/156 |
| 4,901,007 | * | 2/1990 | Sworm ................................. 324/110 |
| 4,904,995 | * | 2/1990 | Bonner et al. ................... 340/870.02 |
| 5,128,611 | * | 7/1992 | Konrad ................................ 324/142 |
| 5,136,514 | * | 8/1992 | Laumann ........................ 364/464.04 |
| 5,153,837 | * | 10/1992 | Shaffer et al. .................. 364/464.04 |
| 5,216,357 | * | 6/1993 | Coppela et al. ...................... 324/142 |
| 5,396,168 | * | 3/1995 | Heep et al. .......................... 324/115 |
| 5,430,430 | * | 7/1995 | Gilbert ........................... 340/310.01 |
| 5,446,370 | * | 8/1995 | Voight ................................ 324/76.11 |
| 5,451,923 | * | 9/1995 | Seberger et al. ................ 340/310.06 |
| 5,548,527 | * | 8/1996 | Hemminger et al. ................ 364/492 |
| 5,555,508 | * | 9/1996 | Munday et al. ..................... 364/492 |
| 5,559,894 | * | 9/1996 | Lubliner et al. ..................... 382/100 |
| 5,631,843 | * | 5/1997 | Munday et al. ..................... 364/492 |
| 5,737,730 | * | 4/1998 | Alvarenga et al. .................. 705/415 |

* cited by examiner

Primary Examiner—Marc S. Hoff
Assistant Examiner—Edward Raymond
(74) Attorney, Agent, or Firm—Harleston Law Firm; Kathleen M. Harleston

(57) ABSTRACT

A consumer-friendly system for monitoring electricity consumption by a residence or business is provided. The system comprises:

(a) a measuring transmitting unit, which comprises: (1) at least two current transformers; (2) means for connecting the measuring transmitting unit to a circuit breaker panel; (3) means for converting AC analog signals to DC analog signals; (4) a microcontroller; (5) a power line carrier transmission interface controller; and (6) a power supply; and (b) a programmable receiving display unit, which comprises: (1) a power supply; (2) a power plug; (3) a power line carrier transmission interface controller; (4) a data decoder and encoder; (5) a microcontroller; (6) memory; (7) a LCD display; and (8) one or more input or mode buttons.

The measuring transmitting unit is capable of translating current flowing in main service power circuit conductors to digitally encoded signals, and transmitting the digitally encoded signals over power circuits in the residence or small business. The receiving display unit is capable of receiving the digitally encoded signals being emitted by the measuring transmitting unit, decoding the digitally encoded signals and translating them to the LCD display showing real-time electrical usage and associated monetary costs for viewing by the consumer. A method for monitoring electricity consumption by a residence or business is also included.

20 Claims, 5 Drawing Sheets

PROGRAMMABLE ELECTRICITY CONSUMPTION MONITOR

BACKGROUND OF THE INVENTION

1. Technical Field

The present invention refers to a system and methods for monitoring electricity usage, preferably a system for continuously measuring and displaying electrical power consumption and cost at a consumer's residence or business through use of existing power lines.

2. Background Information

Our society recognizes its dependence upon electricity for day to day living, as well as the need to develop alternate forms of energy. Reducing power consumption, though advantageous for the public as a whole as well as the private individual, is difficult for the average consumer. The average consumer only receives feedback regarding power consumption upon receipt of a monthly bill from the power company.

A need exists for a practical, programmable, user friendly, affordable, portable system for continuous, contemporaneous monitoring of power consumption without input from the utility company; a system which can easily be installed in the residence or business and understood by the consumer. In general, standard methods of measuring electrical power are known, as are systems for transmitting data through power line carrier transmission technology.

The present invention provides continuous, contemporaneous feedback concerning power usage and cost in the consumer's residence or place of business. The present electricity consumption monitoring system includes a measuring transmitting unit, which is installed in or near the consumer's main electrical panel at the residence or business, and a separate receiving display unit, which is plugged into any wall receptacle inside the residence or business. The measuring transmitting unit encodes and transmits digitally encoded signals over existing power circuits within the home or business. The receiving display unit decodes the signals and translates them to an easy-to-read display. This programmable electrical monitoring system monitors power usage and translates power usage into dollars and cents so that it is understandable to the average consumer. Feedback to the consumer is contemporaneous with each action by the consumer, e.g. tuning on an overhead light in a room. The consumer can use this system to conserve electricity and reduce one's power bill. This monitoring system uses power line carrier transmission technology to transmit information from the measuring transmitting unit to the receiving display unit. Thus, no additional wiring is required within the consumer's premises.

BRIEF SUMMARY OF THE INVENTION

The present invention is a consumer-friendly, easily installed system for monitoring electricity consumption and cost by a residence or business without input from a utility company. The system comprises:

(a) a measuring transmitting unit, comprising:
  (1) at least two current transformers for connecting the measuring transmitting unit to main service power circuits which enter the residence or business;
  (2) means for connecting the measuring transmitting unit to the circuit breaker panel at the residence or business;
  (3) means for receiving AC analog signals from the current transformers, converting the AC analog signals to DC analog signals, summing the DC analog signals, and outputting the information;
  (4) a measuring transmitting unit microcontroller for converting the DC analog signals to digital signals, encoding the digital signals for power line carrier transmission, and performing timing functions;
  (5) a power line carrier transmission interface controller for transmitting the digital signals over existing power circuits within the residence or business; and
  (6) a power supply for powering the measuring transmitting unit; and (b) a programmable receiving display unit, which comprises:
  (1) a power supply for powering the receiving display unit;
  (2) a power plug for plugging the receiving display unit into an AC wall receptacle;
  (3) a power line carrier transmission interface controller for receiving the digital signals from the measuring transmitting unit;
  (4) a data decoder for decoding the digital signals from the measuring transmitting unit;
  (5) a receiving display unit microcontroller for processing information received by the receiving display unit;
  (6) memory for storage of data;
  (7) a liquid crystal diode display for displaying information for viewing by the consumer; and
  (8) one or more input or mode buttons for allowing the consumer to input setup data and control the mode of the liquid crystal diode display; and wherein the measuring transmitting unit is capable of translating current flowing in main service power circuit conductors to digitally encoded signals, and transmitting the digitally encoded signals over existing power circuits in the residence or small business; and wherein the receiving display unit is capable of receiving the digitally encoded signals being emitted by the measuring transmitting unit, decoding the digitally encoded signals, and translating them to the liquid crystal diode display for viewing by the consumer. A method for monitoring electricity consumption by a residence or business is also included.

BRIEF DESCRIPTION OF THE SEVERAL VIEWS OF THE DRAWINGS

A more complete understanding of the invention and its advantages will be apparent from the following detailed description taken in conjunction with the accompanying drawings, wherein examples of the invention are shown, and wherein.

DETAILED DESCRIPTION OF THE INVENTION

Figure 1:
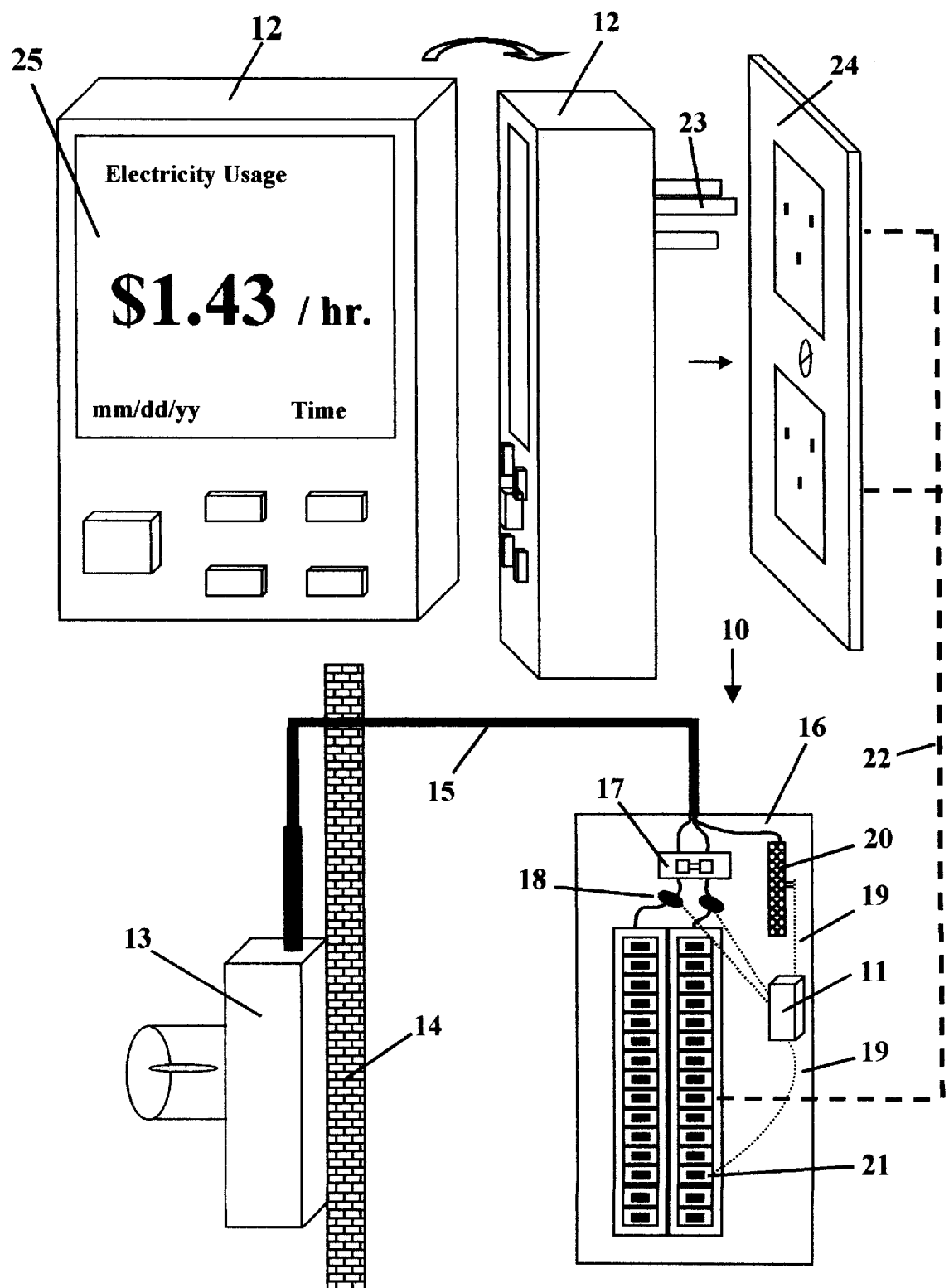
FIG. 1 shows a perspective view of a electricity monitoring system according to the present invention, which includes a measuring transmitting unit and a receiving display unit.

In the following description, like reference characters designate like or corresponding parts throughout the several views. Also, in the following description, it is to be understood that such terms as "front," "back," within," and the like are words of convenience and are not to be construed as limiting terms. Referring in more detail to the drawings, the invention will now be described.

Referring to FIG. 1, a programmable electricity monitoring system 10 according to the present invention comprises a measuring transmitting unit (MTU) 11 and a receiving display unit (RDU) 12.

The measuring transmitting unit 11 is shown at the bottom of FIG. 1. On the left of FIG. 1, a utility KMH (kilowatt hour) meter 13 is shown on an exterior wall 14 of a residence or business. KWH meters are usually installed by power companies on the outside of buildings of their customers to measure power consumption by each customer. A main service power circuit 15 extends from the KWH meter 13 to a main circuit breaker panel 16 (sometimes called a fuse box). The measuring transmitting unit 11 is ideally installed by the user, or an electrician hired by the user, in the main circuit breaker panel 16 of the residence or other building.

FIG. 1 includes a view of the front of the circuit breaker panel 16. At the top of the circuit breaker panel 16 is a main breaker 17. The main breaker can also be a fused switch and is sometimes located in a separate enclosure, either inside or outside the building. For the purpose of this explanation, we will assume there is a main breaker forming part of the circuit breaker panel as shown in FIG. 1. The measuring transmitting unit 11 (MTU) is shown at the right hand side of the circuit breaker panel 16 in FIG. 1. The measuring transmitting unit 11 is connected to the main service power circuit 15 either after or before the main breaker 17 via current transformers (CTs) 18. The current transformers are preferably of the split core type that open up, to pass over and then close, to encircle the main power wires in a way that is similar to a clamp-on ammeter or large paper clip. Preferably, each current transformer includes an integral burden resistor, or is permanently wired to a burden resistor in the MTU, to preclude the possibility of large open circuit voltages associated with open circuit current transformers. The signals sent to the MTU are therefore analog low voltage signals proportional to the amperage flowing through each of the main service power wires. In a single phase three wire system, which is common in most residences, there are two current transformers. In the three phase system typical in businesses, there are three current transformers. The receiving transmitting unit 11 is also connected via external wires 19 to any 15 or 20 amp circuit breaker 21 and the neutral bus bar 20 to provide power to the MTU and a connection to the residence or building power circuits. Individual circuit breakers 21 are shown below the main breaker 17 in FIG. 1. The receiving transmitting unit 11 sums the analog signals, performs an analog-to-digital conversion, and then encodes the digital signal and transmits the encoded signal over existing power wiring 22 within the home or other building using power line carrier transmission technology. Once installed, the measuring transmitting unit 11 will function indefinitely until removed.

The circuit breaker panel 16 is a convenient location for the measuring transmitting unit 11 because the circuit breaker panel is accessible for installation of the transmitting unit and is at the source of power entering the building, yet out of the way of foot traffic in the home or other type of building. The measuring transmitting unit 11 is small, and is preferably enclosed by a protective cover which is less than 4 inches high, 3 inches wide, and 2 inches deep. Its small size is beneficial in that it is easily installed within the circuit breaker panel.

The measuring transmitting unit 11 is easy to install. Once the circuit breaker panel cover is removed, the current transformers 18 are clipped over the main service power wires and the external wires 19 are connected to the neutral bus bar 20 and an individual circuit breaker 21. The service size selector switch is set to match consumer's service size.

At the top of FIG. 1, front and side perspective views of a receiving display unit 12 are provided. On the back of the receiving display unit 12 (see side view in FIG. 1) is a power plug 23. The user simply plugs the receiving display unit 12 into any standard AC wall receptacle 24 in any room in the residence or business. Once the receiving display unit 12 is plugged in, it will commence receiving the digitally encoded signals being emitted over existing power circuits by the measuring transmitting unit 11. The receiving display unit 12 receives and decodes the signals, processes the information through a microcontroller and then displays the information on a liquid crystal diode (LCD) display 25, on the face of the receiving display unit 12. The user need not activate the display to receive the digital information; it is a continuous feed. When the user desires information, he or she simply observes the LCD display 25. The unit will ideally display KW demand and KWH usage, cost consumption, historical data and other information, as well as graphical representations of the information. The user can advance through the information displayed by use of the mode buttons.

The user can leave the receiving display unit 12 in one wall receptacle 24, or it can be moved to a wall receptacle in another room. It is portable, and can be viewed at the user's convenience. Both the receiving display unit 12 and the measuring transmitting unit 11 can easily be removed and reconnected in a different residence or business, such as a relative's home or when the homeowner moves. The receiving display unit has nonvolatile memory so that all measured and programmed data survives when the receiving display unit 12 is unplugged and moved, or during electricity outages. Data will not have been gathered for the period the unit is off-line. For this reason it is most desirable to minimize movement of the device and leave it plugged into one receptacle.

The programmable electricity monitoring system 10 is ideal for use in a residence or small business because of its ease of installation, programming and use. Rather than transferring directly information from the power company (utility) to the consumer, this device will emulate the utility company's energy meter and consumption costs without any input from the utility. The continuous display is easy for a layman to view and comprehend. Any member of the family who is old enough to read is capable of understanding the "$/hr" portion of the display. In short, this electricity usage monitoring system is user-friendly.

The RDU preferably comprises a built in alarm that is user-configured for any demand, or any not-to-exceed value of KWH or "dollars per hour" the user desires. An alarm gets the attention of anyone in the vicinity when a preset level has been reached. The user can program the alarm level, and can change the setting as often as one chooses. The user may wish to locate the receiving display unit in a room that is often frequented, such as the kitchen, den, or bedroom, so that the display can easily be viewed and the alarm easily noticed.

An obvious benefit of the present system is the conservation of electricity and lower electricity bills. The system reduces electricity from some vague concept to an observable quantity.

Measuring Transmitting Unit

Figure 2:
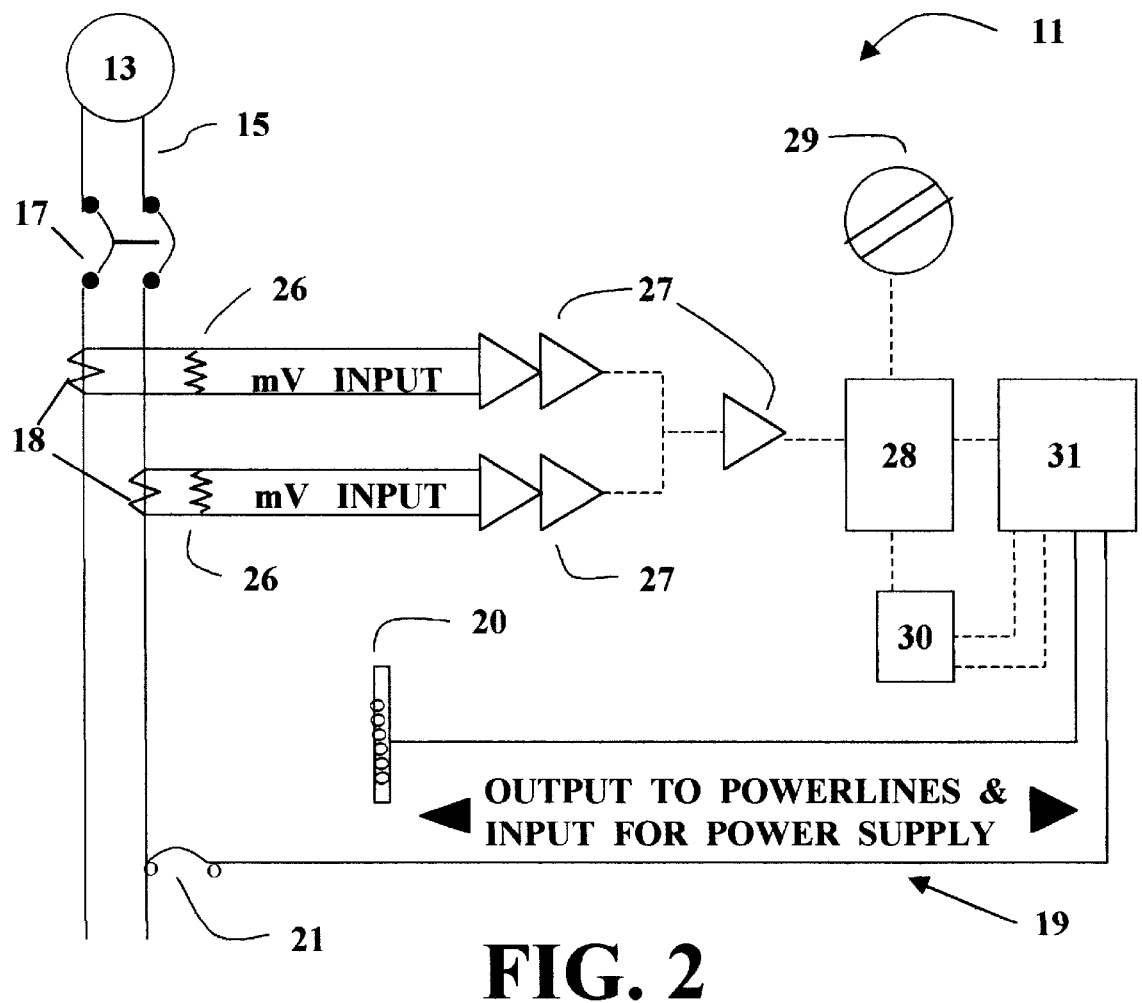
FIG. 2 is a schematic diagram for a measuring transmitting unit according to the present invention.
Figure 3:
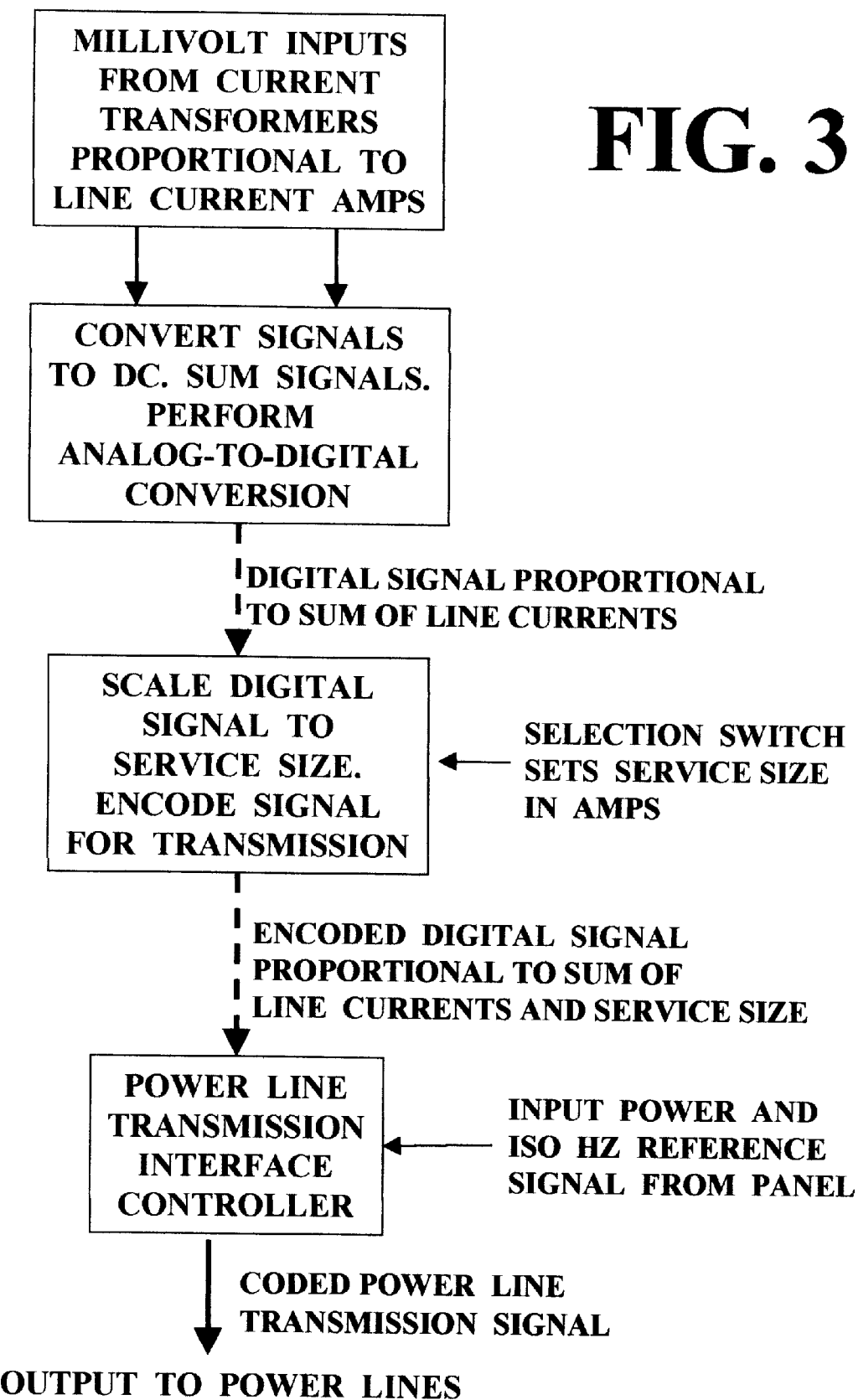
FIG. 3 is a logic diagram for the measuring transmitting unit according to FIG. 2.

FIG. 2 is a schematic diagram showing major components of the measuring transmitting unit (MTU) 11, and FIG. 3 is a logic diagram of the measuring transmitting unit 11 depicting the operation of the MTU 11. Referring to FIG. 2, the main service power circuit 15 typically found in a residence or business runs from the utility company's meter 13 to a main breaker 17 in the consumer's circuit breaker panel 16 or firstly to a separate main breaker (or fused switch) and then to the circuit breaker panel. Two current transformers 18 (three for 3 phase services) clip over the power wires. The current transformers are pre-wired to the MTU. The MTU is also wired to a circuit breaker 21 and the panel neutral bus bar 20 forming a 120V power circuit for the MTU power supply 30. The MTU comprises of a number of amplifiers 27, a microcontroller 28, a power supply 30, a power line carrier transmission interface controller 31, and various standard electronic components such as resistors and capacitors, which are not shown in the figures for clarity.

A real time proportional AC analog current signal is induced in each of the current transformers. The current ($I_{CT}$) induced is equal to the current flowing in the power conductor ($I_L$) times the turns ratio of the current transformer (N). The current is allowed to flow through the burden resistors 26. This converts the signal from current to voltage and protects from hazards associated with open circuit CTs. The voltage produced ($V_{CT}$) is equal to the current $I_{CT}$ times the resistance R. The voltage produced therefore is proportional to the line current.

$$V_{CT}=I_L \times R \times N$$

The values of R and N are chosen such that the signal produced is in millivolts or small volts, and is safe and easily worked with. The voltage produced from each current transformer then forms the input to the amplifiers 27 in the MTU.

Millivolt (mV) input from the current transformers 18 proportional to the line current amps are input via external connections to the MTU. In FIGS. 2 and 3, external connections are indicated by solid lines and internal connections by dashed lines. The amplifiers provide differential input, convert the AC analog signal to a DC analog signal, sum the signals received from each of the power lines (two for single phase, three for 3-phase), provide proper voltage gain for analog-to-digital (A/D) scaling, and output a DC voltage proportional to the total main power line current to the MTU microcontroller 28. Alternatively each of the analog signals could be changed to digital and the digital signals could be summed after A/D conversion.

The MTU microcontroller 28 converts the analog DC signal received to a digital signal via an on chip analog to digital (A/D) converter. A preferred embodiment to improve the accuracy of the present system is a service size selector switch 29 connected to the MTU microcontroller 28. This may be set by the consumer to match as closely as possible the size in amps of the main breaker. The service size then reflects the maximum current that can flow in each leg of the power wires prior to tripping the main breaker or blowing the main fuses. The digital signal is scaled according to the service size selected, so that a signal received which is equal to the service size set would equal the maximum number that can be transmitted using an 8, 10, 12, or 16 bit format. A 10 or 12 bit format is preferred because it balances the cost of transmission and accuracy considerations. For example, a 10 bit format can have any integer number from 0 to 1023. If the selector switch is set to 100 Amps (A) on a single phase system and the current measured in Phase A is 30 A and in Phase B is 50 A, for a sum of 80 A, then the scaled digital signal to be transmitted would be =80 A/(2×100 A)×1023= 409.

The microcontroller then encodes the scaled signal and transmits it to the power line carrier transmission interface controller 31, approximately once per second. The power line carrier transmission interface controller 31 then transmits the digital signal over the existing power circuits within the building using the same wires 19 that power the MTU power supply. The microcontroller also receives a 60 HZ reference signal from these same lines and performs timing functions required by the power line carrier transmission interface controller 31. Power line carrier transmission systems use varying protocols; therefore the specific requirements for timing and encoding of signals vary depending on the type of controller and protocol being used.

FIG. 3 is a logic diagram showing how the AC current flowing in the power lines is changed to a digital, scaled, coded signal, and then transmitted over the existing power circuits within the building using power line carrier transmission technology.

Receiving Display Unit

Figure 4:
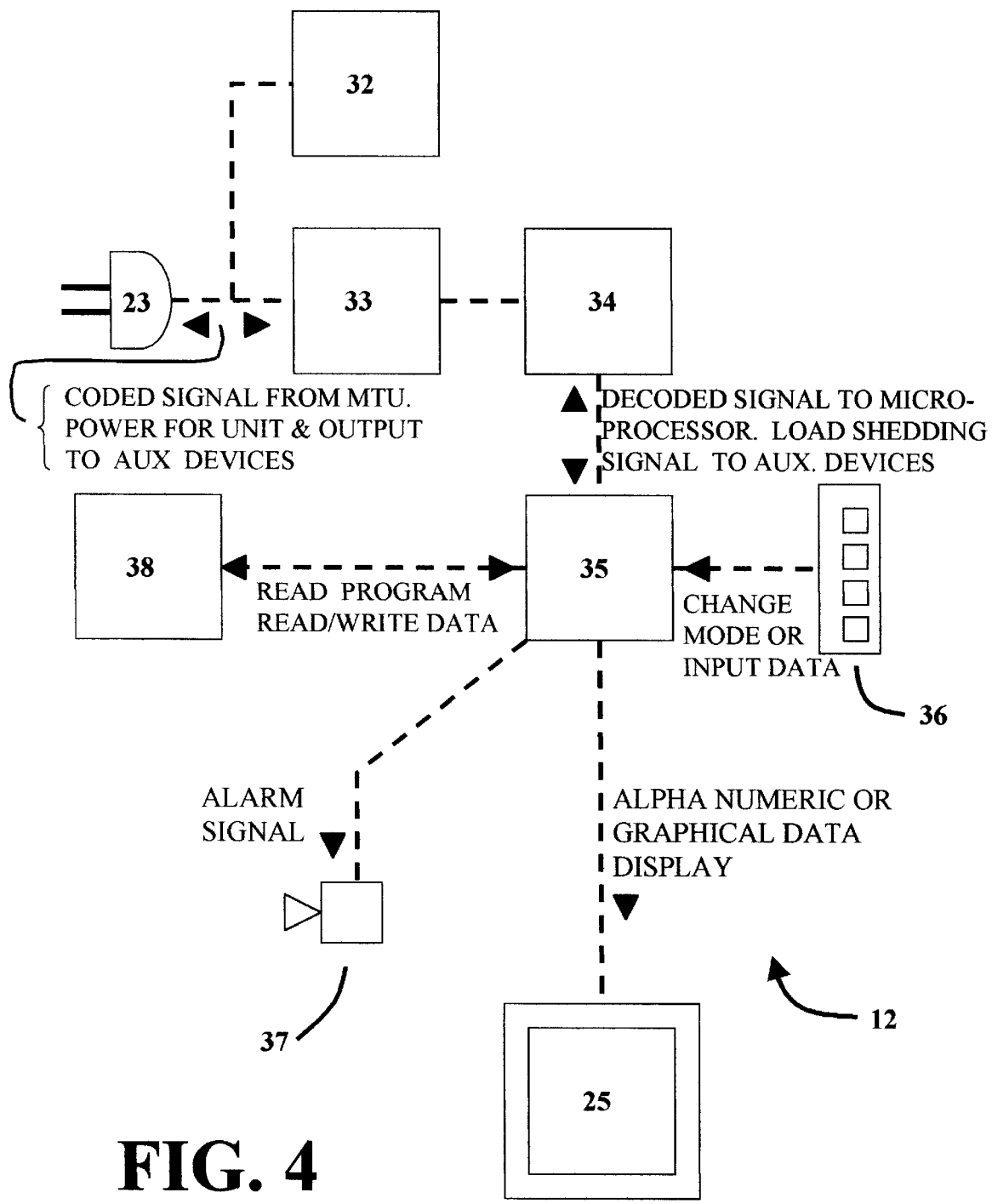
FIG. 4 is a schematic diagram for a receiving display unit according to the present invention.

FIG. 4 is a schematic diagram showing major components of the receiving display unit (RDU) 12. Referring to FIG. 4, the receiving display unit is plugged into a standard wall receptacle via a power plug 23. A coded digital signal is received from the measuring transmitting unit 11 through the building's power wiring using power line carrier transmission technology. The power plug also provides a source of power for the RDU power supply 32, a 60 HZ reference signal necessary to time power line transmissions, and a way to send coded signals back through the power lines for load shedding.

An RDU power line carrier transmission interface controller 33 receives the coded signal from the MTU and a data decoder/encoder 34 decodes the signal. An updated signal is preferably received approximately once per second and this signal is continuously sent to a RDU microcontroller 35. The RDU microcontroller preferably includes internal or external RAM and EEPROM memory 38, for manipulating and storing data PROM or EPROM 38 memory for storing the controlling program. EEPROM stands for Electrical Erasable Programmable Read Only Program, EPROM stands for Erasable Programmable Read Only Program, and PROM stands for Programmable Read Only Program. The microcontroller also includes an internal or external electronic (digital) clock with battery backup. The microcontroller is connected to an LCD 25 display, which is preferably lighted, and a set of input and mode buttons 36 located on the face of the RDU. These buttons allow the user to input setup data and control the mode of the LCD display.

Figure 5:
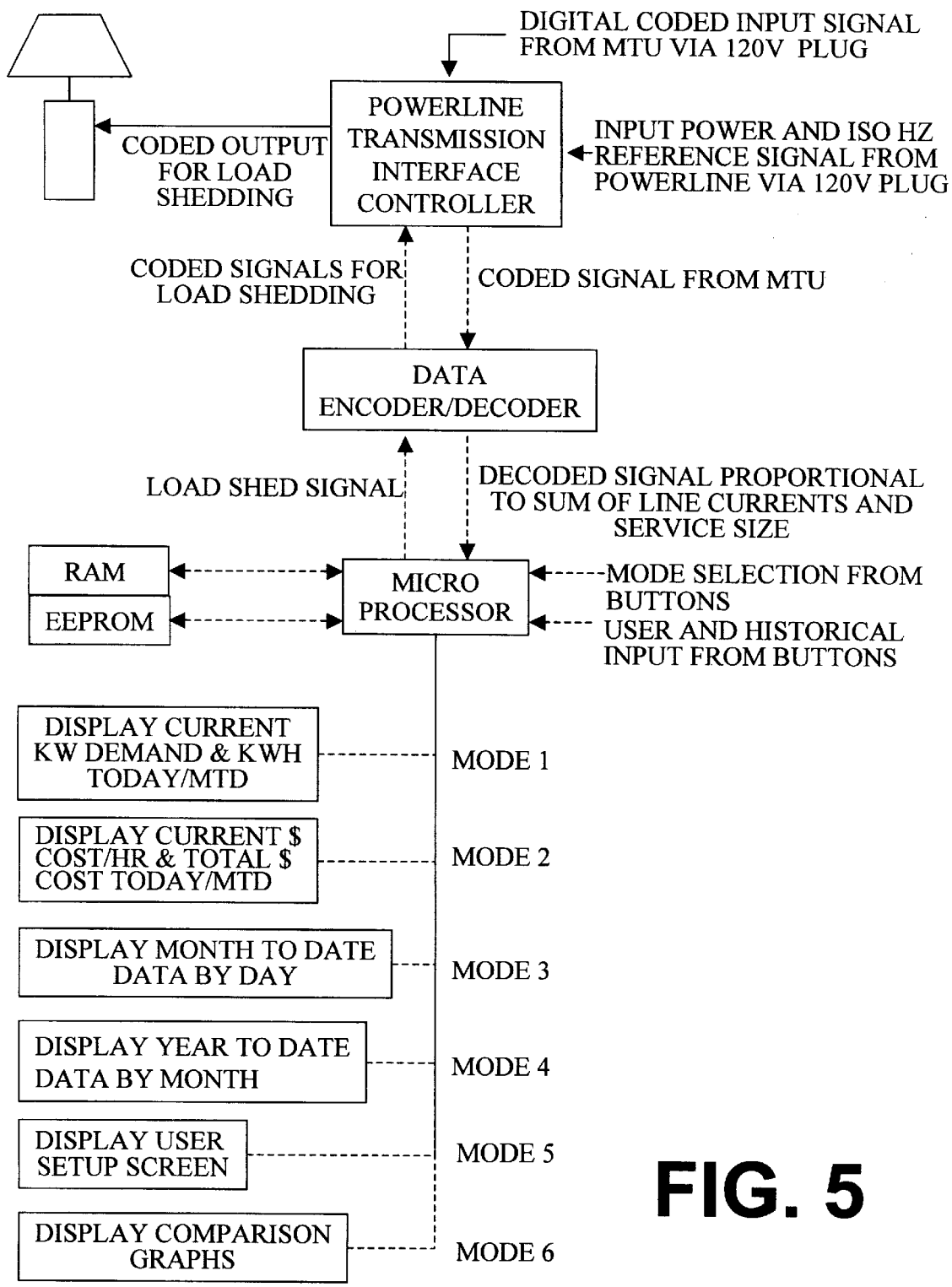
FIG. 5 is a logic diagram for a receiving display unit according to FIG. 4.

FIG. 5 is a logic diagram of the RDU. The operation of the RDU microcontroller 35 is preferably controlled by a program stored in EPROM or PROM memory. Current and historical data and setup parameters are preferably saved in EEPROM. Alternatively, this information can be saved in RAM with battery backup. RAM is used for temporary storage of data. The decoded signal received by the RDU microcontroller 35 is in digital format and is proportional to the sum of the line currents in the main service power lines and the service size selected at the MTU. As part of the setup routine, the user must set the current time and date, select the service size to match the service size selected at the MTU, set the utility meter billing date cycle and input the cost per Kilowatt Hour charged by the utility company. The RDU will preferably accept utility rates that vary with time of day, month of year or with total usage for the month. The user also has the option to adjust the phase to neutral voltage from the preferred default value to more closely match the actual measured voltage at the main circuit breaker. From this information, the microcontroller calculates the current electrical power demand P in kilowatts. Referring to the example cited previously above for the measuring transmitting unit, using a 10 bit transmission format, the service size selector switch set at 100 A at both the MTU and RDU, and a signal being received of 409, the microcontroller makes the reverse calculation for the sum of the line currents:

$$I_L=(409/1023)\times(2\times100)=80 \text{ A}$$

Assuming the user has set the line to neutral voltage at 120V, the current kw power demand is then calculated as:

$$P=I_L V=(80 \text{ A}\times120\text{V})/1000=9.600 \text{ KW}$$

Equivalent routines may be used to overcome computational limitations of the RDU processor. This amount can then be displayed on the LCD screen and will be updated approximately every second. The microcontroller then calculates the current cost of electrical usage per hour by multiplying the KW power demand x the then current utility rate per KWH to derive a current demand cost in Dollars per hour. Models for different countries would use different monetary units. This amount can then be displayed on the LCD screen.

The current signal is most preferably updated every one or two seconds, called the tine period $T_p$. Preferably, the RDU then calculates the total energy consumed KWH over the time period by multiplying the current electrical power demand x time period, adjusting for hours to seconds the calculation is:

$$\text{KWH}=(P\times T_p)/(60\times60).$$

This value is saved in a register in the EEPROM memory (KWH_TODAY). Each time period, KWH is added to the value stored in "KWH_TODAY." The amount stored therefore reflects the total KWH usage accumulated for the day. KWH can then be displayed on the LCD screen. At the end of the day the amount in the register is saved. The daily totals are stored each day for historical purposes. "KWH_TODAY" is then reset to zero and the process begins again for the new day. "KWH_TODAY" can then be displayed on the LCD screen. Similarly, the microcontroller, using the utility billing rate applicable to the time period, stores in memory the current dollar cost so far for the day (DOLLARS_TODAY). This amount can then be displayed on the LCD screen. At the end of the day this amount is saved and registered to zero. At the end of the billing cycle month, the total KWH usage and dollar cost for the month is calculated and recorded. As the RDU uses the same time period as the utility company does for billing purposes, these amounts should closely match the user's electricity bill. The monthly total amounts are saved in EEPROM each month for historical purposes and the month-to-date registers are reset to zero. EEPROM memory is preferably used to ensure that no data is lost in case of power failure or unplugging the RDU.

The microcontroller can manipulate all of the stored data and display the information in various alphanumeric or graphical formats on the LCD screen. The user changes the display screen through the use of the mode buttons.

As part of the setup routine the user can input alarm settings. Alarms can be set for maximum KW demand, maximum dollars per hour power demand, or for maximum dollar cost for the month to date. Alarms will display on the LCD screen. A preferred embodiment will provide an audible alarm.

Another preferred embodiment is to provide load shedding to turn off certain electrical loads when alarm conditions are exceeded. Devices are available that will respond to coded signals and can be used to shut-off appliances and other electrical devices. The user sets the RDU to send out a signal matching the protocol address of the device(s) when an alarm condition is exceeded. These devices will shut off the loads attached to the devices upon receipt of the signal. These devices usually employ error checking to ensure that stray signals do not accidentally cause operation of the device. The RDU microcontroller 35 sends the signal using the same encoder/decoder 34 and power line carrier transmission controller 33 used for receiving the signal from the MTU. Similarly, data from the RDU can be transmitted to a personal computer using existing devices that are on the market.

Programming

The present electrical monitoring system is simple to use and install, and can be programmed by the user. The preferred embodiment can be programmed to sound an alarm or to shut off appliances within the building when a pre-set level of electricity usage is reached. The system receiver can easily be moved from room to room within the residence or business. The entire monitoring system can easily be removed and reinstalled in another residence. The system measures electricity as it is being consumed. For example, if a light is turned on, the electricity thus consumed is contemporaneously displayed (almost immediately) on the receiver display. The user-consumer has a visual measure of how much electricity is consumed by each appliance, etc. in the house. The consumer can adjust usage of the various appliances, depending upon how one wishes to budget. The consumer can reduce usage, or one can postpone usage to periods in the day or night when the power company rates are lower. Many power companies charge on a sliding scale, with a higher rate during peak usage times and a lower rate late at night. The present electricity monitoring system enables the consumer to have greater control over power consumption.

Just after the programmable electricity monitoring system 10 is installed, billing and demand electrical rates charged by the utility company and billing cycle date would be entered manually by the consumer. Preferably, the consumer could enter this historical data from previous months electric bills. This allows the apparatus to begin displaying electrical cost of consumption data in addition to KW (kilowatt) demand and KWH (kilowatt hour) usage. It is only necessary for the consumer to enter this data at initial setup, or when rates are changed by the utility (power) company. An advantage of the present system is that output closely matches monthly billings by the utility company. This apparatus is able to accept various utility billing rates, including time of day changes, month of year changes, and monthly consumption changes. It displays information in a format that is suitable for home or business use. The electrical utility industry is changing rapidly with the onset of deregulation. This will certainly lead to new and more innovative rate schedules. The present device as described is capable of accepting billing rate schedules commonly used today. Future models can incorporate changes that may be required by changing the program stored in PROM or EPROM memory. A preferred embodiment would be to offer updated program versions by allowing the consumer to purchase an updated program chip to update an older model.

A preferred embodiment of the present monitoring system allows automatic load shedding of appliance and other loads. To use this function, the consumer uses the receiving display unit 12 to pre-set a maximum level of electricity demand or daily or monthly consumption. When a pre-set level is reached, the monitoring system will automatically shut off certain appliances in the residence, such as the hot water heater or air conditioner.

The display 25 on the receiving display unit 12 is preferably visual, but the programmable electricity monitoring system 10 could be set up to emit a voice recording. The voice could be heard in addition to or instead of (e.g. for a hearing impaired user) the visual display, and the voice message could sound at the push of a button on the receiving unit 12 or when a specific pre-set usage level is reached.

A user preferably purchases an electricity consumption monitoring system kit from a store for installation in his or her residence or business. This consumer-friendly kit comprises (and preferably consists essentially of) the measuring transmitting unit 11 and separate receiving display unit 12 described herein. An energy saving tip booklet and installation instructions would ideally be included in the kit.

The kit is preferably comprised of two separate units: a measuring transmitting unit, and a programmable receiving display unit, as described herein. The measuring transmitting unit 11 preferably further comprises:
 a service size selector switch 29 for inputting to the MTU microcontroller 28.
 at least two, preferably seven, amplifiers 27;
 two or three burden resistors 26 for converting a current signal from the current transformers to voltage; and/or
The receiving display unit further comprises:
 an audible alarm 37;
 a digital clock with a battery back-up.
 RAM or EEPROM memory for manipulating and storing data, and PROM or EPROM memory for storing a software program; and/or
 a means for transmitting coded signals back through the power lines in the residence or business for load shedding.

The measuring transmitting unit, except for the power wires 19 and the current transformers 18, is preferably enclosed by a protective cover, the protective cover and is small, measuring less than about 4 inches in height, 3 inches in width, and 2 inches deep. The two current transformers are preferably of the split core type. The receiving display unit is enclosed by a protective cover. The protective cover preferably measures between about 3 and 6 inches in length, 3 and 6 inches in width, and 1 and 2 inches in depth.

The present system is preferred for use in residences or small businesses with services sizes less than or equal to 400 Amps.

For new residences and buildings, a preferred embodiment of the present system is to have the manufacturer of the main circuit breaker or the manufacturer of the circuit breaker panel incorporate the MTU within and as part of the main circuit breaker or panel. Once a main breaker containing the MTU option is installed in the circuit breaker panel or a panel with the MU option is installed during the construction, the home or business owner needs to purchase only the MTU portion and plug it in to have an operational electricity monitor.

In a preferred embodiment, the measuring transmitting unit 11 is designed to mount in or near the consumer's main circuit breaker panel 16 (main switch box or main panel box) and includes the following.

1. Specially designed split core current transformers 18 with squeeze clips to allow safe, easy installation over the consumer's main service power lines 15 without disconnecting power, to measure amperage of main supply lines and integral burden resistor 26 to convert amperage signals to millivolt signals.
2. A protected power supply to provide power for the measuring transmitting unit 11 from an individual breaker 21 in the consumer's circuit breaker panel 16.
3. Amplifiers 27 to provide differential input, convert AC signal to DC, provide proper voltage gain for A/D conversion, and sum the signals from each current transformer.
4. A microcontroller to perform analog-to-digital conversion, scale the signal to service size, encode the signal for transmission, synchronize signals with power line frequency and provide timing for signal bursts to the transmitter.
5. An opto-coupled Power Line Carrier Technology (PLCT) transmitter to transmit signal over the consumer's existing power lines.

Power in KW is equal to the voltage times the current times the power factor for single phase systems. Power in KW is equal to the line voltage times the current times the power factor times the √(square root) of 3 for three-phase systems. In both cases, for grounded neutral systems, power in KW is equal to the sum of (the phase current times the phase to neutral voltages), times the power factor.

The preferred measuring transmitting unit does not measure the voltage of consumer supply lines but instead assumes a standard constant utility phase-to-neutral supply voltage and sets this as the preferred default value. For a North American model, the default value would be set to match the average utility supply voltage in United States metropolitan areas. The user/consumer will have the option to adjust this value at the receiving display unit 12. Power factor is assumed to be unity. These assumptions make the device unsuitable for utility billing, or for precise measurement usually required by large power users. Rather, this device is designed to continuously simulate, with an reasonable degree of accuracy, the energy usage measured by and the billing rendered by the utility. The device is designed for residential and small business use and emphasizes ease of use and installation and reasonable cost. Alternatively, the supply voltage could be measured by the MTU and the MTU could calculate power and transmit a signal proportional to power rather than current, or both voltage and current data could be measured and transmitted and the power calculation made by the RDU. The preferred device, for the North American market, does not measure voltage as voltage regulation in most parts of the United States and Canada is very good and exceeds the accuracy achievable through voltage measurement, without the use of exceedingly expensive components. There will preferably be two different models for the measuring transmitting unit. A single phase measuring transmitting unit is preferred for residential and small business use, and a three phase unit is preferred for commercial use. A selector switch on the measuring transmitting unit 11 will allow the consumer to set the MTU 11 to standard electrical service sizes. For example: 60 A, 100 A, 150 A and 200 A for a single phase unit and 100 A, 200 A, 300 A & 400 A for a three phase unit.

The preferred MTU 11 is designed to plug into any standard 120 volt receptacle within the consumer's premises and most preferably includes the following.
 1. An opto-coupled PLCT receiver/transmitter to receive signals from the MTU.

2. A protected power supply to receive power from consumer's supply and convert for use by the receiving display unit.
3. A first microcontroller to synchronize signals with the power line frequency and provide timing and error checking for receiving signals from the MTU and provide analog to digital conversion.
4. A digital clock with battery backup to maintain accurate time in case of power failure.
5. A PROM or EPROM chip to store the software program, a RAM chip for data manipulation, and an EEPROM chip to store current and historical data and setup parameters.
6. Input buttons to allow the consumer to input setup data and alter display modes of the LCD.
7. A second microcontroller to receive confirmed data from the first microcontroller, receive data from consumer operable input mode buttons, run the software program, retrieve and save information from memory, transmit display information to LCD display, transmit data to the first microcontroller and then to the PLCT receiver/transmitter unit for load shedding by remote PLCT devices or further manipulation by a personal computer. Any or all of the above functions may be combined in currently available electronic components.

In regard to the LCD display on the receiving display unit, the following information can be preferably selected for display through a number of preferred display modes. Current and historical electrical usage and cost data can be displayed for the consumer to use in conserving energy and cutting electricity costs.

a. Current time and date
b. Current electrical usage in kilowatts (KW)
c. Current cost for electrical usage in dollars per hour (or other currency for non-U.S. models)
d. Total electrical usage so far today in kilowatt hours (KWH)
e. Total cost for electricity so far today in dollars
f. Total electrical usage so far this month in kilowatt hours
g. Total cost for electricity this month so far in dollars
h. Energy used each hour for the past 48 hours in KWH and dollars
i. Energy used each day for the past 60 days in kilowatt hours and dollars
j. Total energy used each month for the past two years in kilowatt hours and dollars
k. Graphical displays of the above information The program is easily modified during manufacture to incorporate updated enhancements simply by modifying the program installed in PROM or EPROM. Specific information displayed and format will be tailored to consumer demand. From the foregoing it can be realized that the described device of the present invention may be easily and conveniently utilized as a system which will continuously monitor and display electricity usage in a residence or business. The present monitoring system measures and displays electrical usage in a residence or small business independent of the utility electrical meter and independent of any signal from the utility company.

While preferred embodiments of the invention have been described using specific terms, this description is for illustrative purposes only. It will be apparent to those of ordinary skill in the art that various modifications may be made without departing from the spirit or scope of the invention, and that such modifications are intended to be within the scope of the present invention.

BRIEF LIST OF REFERENCE NUMBERS USED IN THE DRAWINGS 10 programmable electricity monitoring system
11 measuring transmitting unit (MTU)
12 receiving display unit (RDU)
13 utility KWH (kilowatt hour) meter
14 outside wall
15 main service power circuit
16 circuit breaker panel
17 main circuit breaker
18 current transformers (CTs)
19 MTU power wires
20 neutral bus bar
21 individual circuit breakers
22 existing power wiring
23 power plug
24 120 V AC wall receptacle
25 display
26 burden resistors
27 amplifiers
28 MTU microcontroller
29 service size selector switch
30 MTU power supply
31 MTU power line carrier transmission interface controller (transmit)
32 RDU power supply
33 RDU power line carrier transmission interface controller (transmit and receive)
34 data decoder/encoder
35 RDU microcontroller
36 input and mode buttons
37 alarm
38 program and data RAM, PROM, EPROM, and EEPROM memory

What is claimed is:
1. A consumer-friendly, easily installed, programmable system for monitoring electricity consumption by a residence or business, the system comprising:
  (a) a measuring transmitting unit, comprising:
    (1) at least two current transformers for connecting the measuring transmitting unit to main service power circuits which enter the residence or business;
    (2) at least two power wires for connecting the measuring transmitting unit to the circuit breaker panel at the residence or business;
    (3) means for receiving AC analog signals from the current transformers, converting the AC analog signals to DC analog signals, summing the DC analog signals, and outputting the information;
    (4) a microcontroller for converting the DC analog signals to digital signals, encoding the digital signals for power line carrier transmission, and performing timing functions;
    (5) a power line carrier transmission interface controller for transmitting the digital signals over existing power circuits within the residence or business; and
    (6) a power supply for powering the measuring transmitting unit; and
  (b) a programmable receiving display unit, which comprises:
    (1) a power supply for powering the receiving display unit;
    (2) a power plug for plugging the receiving display unit into an AC wall receptacle;

(3) a power line carrier transmission interface controller for receiving the digital signals from the measuring transmitting unit;
(4) a data decoder for decoding the digital signals from the measuring transmitting unit;
(5) microcontroller for processing information received by the receiving display unit;
(6) memory for storage of data;
(7) a liquid crystal diode display for displaying information for viewing by the consumer; and
(8) one or more input or mode buttons for allowing the consumer to input setup data and control the mode of the liquid crystal diode display; and wherein the system does not receive data input from a utility company;

wherein the measuring transmitting unit is capable of translating current flowing in main service power circuit conductors to digitally encoded signals, and transmitting the digitally encoded signals over existing power circuits in the residence or small business; and wherein the receiving display unit is capable of receiving the digitally encoded signals being emitted by the measuring transmitting unit, decoding the digitally encoded signals, and translating them to the liquid crystal diode display for viewing by the consumer.

2. A system according to claim 1, wherein the means for receiving AC analog signals from the current transformers, converting the AC analog signals to DC analog signal, summing the DC analog signals, and outputting the information, is at least two amplifies.

3. A consumer-friendly, easily installed, programmable system for monitoring electricity consumption by a residence or business without data input from a utility company, the system comprising:

(a) a measuring transmitting unit, comprising:
(1) at least two current transformers adapted for connecting the measuring transmitting unit to main service power circuits which enter the residence or business;
(2) two or three burden resistors d for converting a current signal from the current transformers to a voltage signal;
(3) at least two power wires, one of which is connected to a neutral bus and one of which is connected to an individual circuit breaker in a circuit breaker panel;
(4) at least two amplifiers adapted for receiving AC analog signals from the current transformers, converting the AC analog signals to DC analog signals, summing the DC analog signals, and outputting the information;
(5) a microcontroller adapted for converting the DC analog signals to digital signals, encoding the digital signals for power line carrier transmission, and performing timing functions;
(6) a power line carrier transmission interface controller adapted for transmitting the digital signals over existing power circuits within the residence or business; and
(7) a power supply for powering the measuring transmitting unit; and (b) a programmable receiving display unit, which comprises:
(1) a power supply for powering the receiving display unit:
(2) a power plug for plugging the receiving display unit into an AC wall receptacle;
(3) a power line carrier transmission interface controller adapted for receiving the digital signals from the measuring transmitting unit;
(4) a data decoder adapted for decoding the digital signals from the measuring transmitting unit;
(5) microcontroller adapted for processing information received by the receiving display unit
(6) memory for storage of data;
(7) a visual display adapted for displaying information for viewing by the consumer; and
(8) one or more input or mode buttons adapted for inputting data and controlling the mode of the display; and wherein the measuring transmitting unit is adapted for translating current flowing main service power circuit conductors to digitally encoded signals, and transmitting the digitally encoded signals over existing power circuits in the residence or small business; and wherein the receiving display unit is adapted for receiving the digitally encoded signals being emitted by the measuring transmitting unit, decoding the digitally encoded signals, and translating them to the display for viewing by the consumer.

4. A system according to claim 3, wherein the receiving display unit further comprises a digital clock with battery back-up, and a protective cover for enclosing the receiving display unit.

5. A system according to claim 4, wherein the receiving display unit comprises RAM or EEPROM memory for manipulating and storing data, and PROM or EPROM memory for storing a software program.

6. A consumer-friendly, easily installed, programmable system for monitoring electricity consumption by a residence or business without data input from a utility company, the system comprising:

(a) a measuring transmitting unit, comprising:
(1) at least two current transformers adapted for connecting the measuring transmitting unit to main service power circuits which enter the residence or business;
(2) at least two power wires, one of which is connected to a neutral bus and one of which is connected to an individual circuit breaker in a circuit breaker panel;
(3) at least two amplifiers adapted for receiving AC analog signals from the current transformers, converting the AC analog signals to DC analog signals, summing the DC analog signals, and outputting the information;
(4) a microcontroller adapted for converting the DC analog signals to digital signals, encoding the digital signals for power line carrier transmission, and performing timing functions;
(5) a power line carrier transmission interface controller adapted for transmitting the digital signals over existing power circuits within the residence or business;
(6) a power supply for powering the measuring transmitting unit;
(7) two or three burden resistors adapted for converting a current signal from the current transformers to a voltage signal; and
(8) a service size selector switch for input to the measuring transmitting unit microcontroller; and (b) a programmable receiving display unit which comprises:
(1) a power supply for powering the receiving display unit;

(2) a power plug for plugging the receiving display unit into an AC wall receptacle;

(3) a power line carrier transmission interface controller adapted for receiving the digital signals from the measuring transmitting unit;

(4) a data decoder adapted for decoding the digital signals from the measuring transmitting unit;

(5) microcontroller adapted for processing information received by the receiving display unit;

(6) memory for storage of data;

(7) a visual display for displaying information for viewing by the consumer; and (8) one or more input or mode buttons adapted for inputting setup data and controlling the mode of the display; and wherein the measuring transmitting unit is capable of translating current flowing in main service power circuit conductors to digitally encoded signals, and transmitting the digitally encoded signals over existing power circuits in the residence or small business; and wherein the receiving display unit is capable of receiving the digitally encoded signals being emitted by the measuring transmitting unit, decoding the digitally encoded signals, and translating them to the display for viewing by the consumer.

7. A system according to claim 6, wherein the receiving display unit further comprises a means for transmitting coded signals back through the power circuits in the residence or business for information and load shedding.

8. A system according to claim 6, wherein the receiving display unit further comprises a visual or audible alarm, and wherein the liquid crystal diode display is lighted.

9. A system according to claim 8, wherein the power plug transmits power for the power supply, and a reference signal for timing power line carrier transmissions.

10. A system according to claim 9, for use in single phase services, wherein the system comprises two current transformers of a split core type.

11. A system according to claim 9, for use in three phase services wherein the system comprises three current transformers.

12. A system according to claim 10, wherein the measuring transmitting unit is enclosed by a protective cover which is no more than about 4 inches high, 3 inches wide, and 2 inches deep.

13. A system according to claim 10, wherein the receiving display unit is enclosed by a protective cover, the protective cover measuring between about 3 and 6 inches in length, 3 and 6 inches in width, and 1 and 2 inches in depth.

14. A kit for monitoring electricity consumption by a residence or business, the kit comprising a programmable system comprising:

(a) a measuring transmitting unit, comprising:

(1) at least two current transformers adapted for connecting the measuring transmitting unit to main service power circuits which enter the residence or business;

(2) means for connecting the measuring transmitting unit to the circuit breaker panel at the residence or business;

(3) means for receiving AC analog signals from the current transformers converting the AC analog signals to DC analog signals, summing the DC analog signals and outputting the information;

(4) a microcontroller adapted for converting the DC analog signals to digital signals, encoding the digital signals for power line carrier transmission, and performing timing functions;

(5) a power line carrier transmission interface controller adapted for transmitting the digital signals over existing power circuits within the residence or business; and (6) a power supply for powering the measuring transmitting unit; and (b) a programmable receiving display unit, which comprises:

(1) a power supply for powering the receiving display unit;

(2) a power plug for plugging the receiving display unit into an AC wall receptacle;

(3) a power line carrier transmission interface controller adapted for receiving the digital signals from the measuring transmitting unit;

(4) a data decoder adapted for decoding the digital signals from the measuring transmitting unit;

(5) microcontroller adapted for processing information received by the receiving display unit;

(6) memory for storage of data;

(7) a visual display adapted for displaying information for viewing; and (8) at least one input or mode button adapted for inputting data and controlling the mode of the display.

15. A kit according to claim 14, wherein the receiving display unit comprises RAM or EEPROM memory for manipulating and storing data, and PROM or EPROM memory for storing a software program.

16. A kit according to claim 14, wherein the measuring transmitting unit further comprises two or three burden resistors for converting a current signal from the current transformers to a voltage signal.

17. A method for monitoring electricity consumption by a residence or business, the method comprising the following steps:

(a) electrically connecting a measuring transmitting unit to a neutral bus, and the measuring transmitting unit to an individual circuit breaker in a circuit breaker panel;

(b) measuring current in main service power conductors using current transformers, and converting analog signals from the current transformers to digital signals;

(c) encoding the digital signals and transmitting them over existing power lines in the residence or business using power line carrier technology;

(d) receiving the encoded digital signals from the power lines, decoding the encoded digital signals, and performing mathematical operations to convert the decoded digital signals to power measurements in kilowatts, kilowatt hours, or currency units;

(e) saving the information in memory; and (f) displaying the information on a visual display for viewing by the consumer.

18. A method according to claim 17, further comprising the step of sounding an audio or visual alarm at a pre-set electricity consumption level which has been programmed by a consumer.

19. A method for monitoring electricity consumption by a residence or business, the method comprising the following steps:

(a) measuring current in main service power conductors using current transformers, and converting analog signals from the current transformers to digital signals;

(b) encoding the digital signals and transmitting them over existing power lines in the residence or business using power line carrier technology;

(c) receiving the encoded digital signals from the power lines, decoding the encoded digital signals, and performing mathematical operations to convert the decoded digital signals to power measurements in kilowatts, kilowatt hours, or currency units;

(d) saving the information in memory; and (e) load shedding at a pre-set electricity consumption level.

20. A method according to claim 19, further comprising the step of sounding an audio or visual alarm at the pre-set electricity consumption level and displaying the information on a visual display for viewing.

* * * * *